US008796049B2

(12) United States Patent
Cadotte et al.

(10) Patent No.: US 8,796,049 B2
(45) Date of Patent: Aug. 5, 2014

(54) UNDERFILL ADHESION MEASUREMENTS AT A MICROSCOPIC SCALE

(75) Inventors: Maxime Cadotte, Granby (CA); Marie-Claude Paquet, Bromont (CA); Julien Sylvestre, Chambly (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/561,661

(22) Filed: Jul. 30, 2012

(65) Prior Publication Data

US 2014/0030827 A1    Jan. 30, 2014

(51) Int. Cl.
*G01R 31/26* (2014.01)
*H01L 21/00* (2006.01)
*G01N 3/24* (2006.01)

(52) U.S. Cl.
USPC .............. 438/15; 438/14; 438/106; 438/108; 73/841; 73/842; 73/845

(58) Field of Classification Search
USPC ............... 438/14–15, 106, 108, 112–113, 438/122–127; 257/E21.503, E23.119, 257/E21.502, E23.087, 778; 73/150 A, 73/841–842, 760, 781, 827, 856, 845
See application file for complete search history.

(56) References Cited

U.S. PATENT DOCUMENTS

| | | | | |
|---|---|---|---|---|
| 4,855,012 A | * | 8/1989 | Sumi ........................... | 156/759 |
| 5,667,884 A | * | 9/1997 | Bolger ......................... | 428/323 |
| 5,696,327 A | * | 12/1997 | Huang et al. ................. | 73/845 |
| 5,959,363 A | * | 9/1999 | Yamada et al. ............... | 257/787 |
| 6,117,695 A | * | 9/2000 | Murphy et al. ............... | 438/15 |
| 6,506,681 B2 | * | 1/2003 | Grigg et al. .................. | 438/692 |
| 6,569,512 B2 | * | 5/2003 | Takezawa et al. ............ | 428/209 |
| 6,617,399 B2 | * | 9/2003 | Konarski ...................... | 525/523 |
| 6,681,640 B2 | * | 1/2004 | Canumalla .................... | 73/856 |
| 6,774,501 B2 | * | 8/2004 | Kurafuchi et al. ............ | 257/788 |
| 6,841,030 B2 | * | 1/2005 | Sasada ......................... | 156/701 |
| 6,940,175 B2 | * | 9/2005 | Iwazaki et al. ............... | 257/777 |
| 7,109,061 B2 | * | 9/2006 | Crane et al. .................. | 438/118 |
| 7,287,418 B2 | * | 10/2007 | Yang et al. ................... | 73/81 |
| 7,319,275 B2 | * | 1/2008 | Cowens et al. ............... | 257/778 |
| 7,329,944 B2 | * | 2/2008 | Seki et al. .................... | 257/666 |
| 7,371,606 B2 | * | 5/2008 | Ujiie et al. ................... | 438/106 |
| 7,555,961 B2 | * | 7/2009 | Sykes ........................... | 73/841 |
| 7,628,065 B2 | * | 12/2009 | Yang et al. ................... | 73/150 A |

(Continued)

OTHER PUBLICATIONS

Shi et al., "Recent advances in the development of no-flow underfill encapsulants—A practical approach towards the actual manufacturing application", IEEE Transactions on Electronics Packaging Manufacturing, vol. 22, No. 4, Oct. 1999, pp. 331-339.*

(Continued)

*Primary Examiner* — Mary Wilczewski
*Assistant Examiner* — Erik T Peterson
(74) *Attorney, Agent, or Firm* — David Cain; Roberts Mlotkowski Safran & Cole, P.C.

(57) ABSTRACT

Methods and systems to method to determine an adhesion force of an underfill material to a chip assembled in a flip-chip module are provided. A method includes forming a flip-chip module including a chip connected to a substrate with a layer of underfill material adhered to the chip and the substrate. The method also includes forming a block from the layer of underfill material. The method further includes measuring a force required to shear the block from a surface of the flip-chip module.

20 Claims, 3 Drawing Sheets

(56) References Cited

U.S. PATENT DOCUMENTS

| | | | |
|---|---|---|---|
| 7,730,790 B2* | 6/2010 | Sykes | 73/842 |
| 7,765,861 B2 | 8/2010 | Jacquemin | |
| 7,980,757 B2* | 7/2011 | Lai et al. | 374/5 |
| 8,008,124 B2* | 8/2011 | Yasuda | 438/108 |
| 8,044,511 B2* | 10/2011 | Kato et al. | 257/737 |
| 8,312,777 B2* | 11/2012 | Sykes | 73/842 |
| 8,429,960 B2* | 4/2013 | Landru | 73/150 A |
| 2001/0012642 A1* | 8/2001 | Kodnani et al. | 438/107 |
| 2003/0036292 A1* | 2/2003 | Banba et al. | 438/780 |
| 2003/0172749 A1* | 9/2003 | Nishiyama | 73/862.393 |
| 2005/0049350 A1* | 3/2005 | Tonapi et al. | 524/492 |
| 2005/0116138 A1* | 6/2005 | Hanada et al. | 250/206 |
| 2005/0221094 A1* | 10/2005 | Uchida et al. | 428/418 |
| 2006/0275952 A1 | 12/2006 | Gowda et al. | |
| 2008/0090085 A1* | 4/2008 | Kawate et al. | 428/413 |
| 2009/0039486 A1* | 2/2009 | Shimazaki et al. | 257/676 |
| 2009/0051369 A1* | 2/2009 | Kogut et al. | 324/658 |
| 2009/0137129 A1* | 5/2009 | Kojima et al. | 438/725 |

OTHER PUBLICATIONS

Chen et al., "Effects of underfill materials on the reliability of low-k flip chip packaging", Microelectronics Reliability, vol. 46, 2006, pp. 155-163.*

Braun et al., "High-temperature reliability of flip chip assemblies", Microelectronics Reliability, vol. 46, 2006, pp. 144-154.*

Lau et al. "Effects of underfill material properties on the reliability of solder bumped flip chip on board with imperfect underfill encapsulants", IEEE Transactions on Components and Packaging Technologies, vol. 23, No. 2, Jun. 2000, pp. 323-333.*

McEnteggart, I., "Characterisation of Interfacial Cracking in Microelectronic Packaging", Instron Limited, downloaded Feb. 19, 2011, 6 pages.

Myung-Jin, Y. et al., "Highly Reliable Non-Conductive Adhesives for Flip Chip CSP Applications", IEEE, vol. 26, No. 2, Apr. 2003, pp. 150-155.

Yao, Q. et al., "Adhesion Enhancement of Underfill Materials by Silane Additives", Packaging Research Center, Georgia Institute of Technology, Mar. 1999, 4 pages.

Kornain, Z. et al., "Comparative Study of Phenolic-Based and Amine-Based Underfill Materials in Flip Chip Plastic Ball Grid Array Package", http://scitation.aip.org/getabs/servlet/GetabsServlet?prog=normal&id=JEPAE40001320000040410120000001&idtype=cvips&gifs=yes&ref=no, J. Electron Package, vol. 132, Issue 4, Dec. 2010, Abstract only, pp. 1-2.

"Royce 600 Series: Bond Test Instruments", http://www.royceinstruments.com/images/royce_files/Royce-Series-600-brochure.pdf, downloaded Jul. 5, 2012, 8 pages.

* cited by examiner

UNDERFILL ADHESION MEASUREMENTS AT A MICROSCOPIC SCALE

FIELD OF THE INVENTION

The invention relates to semiconductor structures and methods of testing and, more particularly, to measuring the adhesion of an underfill material in a manufactured integrated circuit module.

BACKGROUND

In a typical flip-chip electronic package, an integrated circuit (IC) chip (also referred to as a die) is joined to a substrate through a series of solder connections. The substrate is typically a ceramic or organic laminate, and the solder connections may comprise controlled collapse chip connection (C4) bumps. An underfill material is provided in the space between the chip and the substrate and encapsulating the solder connections. The underfill is usually an epoxy resin and commonly includes inorganic fillers such as silica.

A common problem with flip-chip packages is delamination of various layers of the package. For example, delamination of the underfill from the chip can result from mismatched coefficients of thermal expansion (CTE) between the respective materials of the package. When the package is raised to an elevated temperature, e.g., during thermal cycling testing or field operation (actual use), the mismatched CTE's can produce thermally-induced mechanical stress within the package, which can lead to delaminating, cracking, and electronic failure of the chip.

In light of the delaminating, and for development and manufacturing troubleshooting purposes, it is desirable to have a method to rapidly predict the adhesion reliability of the underfill to the chip in thermal cycling testing or field operation. Some adhesion tests are performed using underfill material adhered to a surface similar to that used in a package. However, these tests do not utilize an actually manufactured IC module, and thus do not accurately measure the adhesion of the underfill as it is affected by aspects of the manufacturing processes. As a result, these tests do not show good correlation with the actual reliability of the packages, due to differences with the geometry and process conditions between the manufactured modules and laboratory experiments. Other adhesion tests do utilize a manufactured module, but are performed at a macroscopic scale, e.g., shearing an entire chip off of the laminate. Such macroscopic tests do not isolate the adhesion of the underfill, and instead measure the adhesion of the entire interface between the chip and laminate including the adhesion at the solder connections.

Accordingly, there exists a need in the art to overcome the deficiencies and limitations described hereinabove.

SUMMARY

In a first aspect of the invention, there is a method that includes forming a flip-chip module including a chip connected to a substrate with a layer of underfill material adhered to the chip and the substrate. The method also includes forming a block from the layer of underfill material. The method further includes measuring a force required to shear the block from a surface of the flip-chip module.

In another aspect of the invention, there is a method to determine an adhesion force of an underfill material to a surface in a flip-chip module. The method includes forming trenches in the underfill material, wherein the trenches create at least one free-standing block of the underfill material adhered to the surface. The method also includes pressing a blade against a wall of the at least one block until the at least one block dislocates from the surface. The method additionally includes measuring a force applied by the blade during the dislocating of the at least one block from the surface.

In yet another aspect of the invention, there is a method comprising measuring adhesion of an underfill material to a chip at a plurality of locations on the chip, wherein the underfill material and the chip are included in a manufactured module.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of testing and, more particularly, to measuring the adhesion of an underfill material in a manufactured integrated circuit package. In accordance with aspects of the invention, an integrated circuit (IC) module is manufactured to include a chip connected to a substrate via solder connections and underfill adhered to the chip and substrate. The substrate is removed, e.g., via grinding, thereby exposing the underfill adhered to the chip. The exposed underfill is diced into discrete blocks while still adhered to the chip. Each block may be individually sheared from the chip in a controlled manner while measuring the force required to accomplish the shearing. In this manner, the adhesion of the underfill to the chip is measured at a microscopic scale at plural locations across the chip, which provides insight into localized values of underfill adhesion across the chip. Moreover, by utilizing an actually manufactured module, implementations of the invention provide adhesion measurements that accurately reflect the effects of manufacturing processes, such as underfill filler segregation, geometry, surface characteristics, cure profiles, etc.

Figure 1:
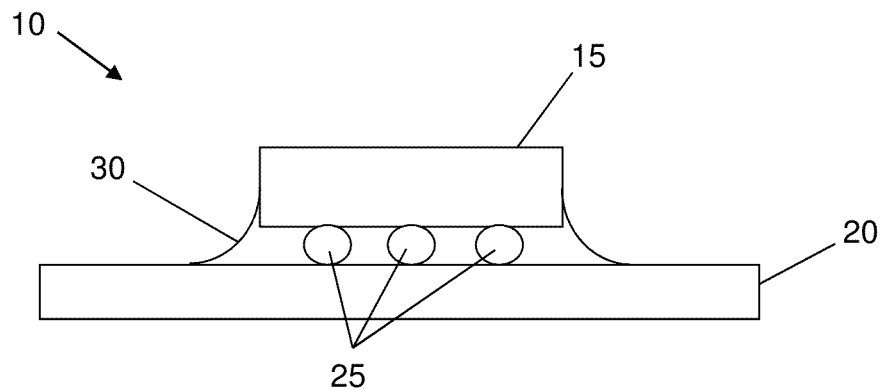
FIGS. 1-6 show a module and processing steps in accordance with aspects of the invention.

FIG. 1 shows a module 10 comprising a chip 15 connected to a substrate 20 via solder connections 25 with an underfill 30 between the chip 15 and the substrate 20 and encapsulating the solder connections 25. In embodiments, the module 10 is made using conventional semiconductor manufacturing processes and materials.

For example, the chip 15 may comprise a layered semiconductor structure (e.g., an IC die) and the substrate 20 may comprise an organic laminate. The module 10 may be formed, for example, by forming solder bumps at bond pads of plural chips contained in a wafer, dicing the wafer into plural die including chip 15, bringing the solder bumps of the chip 15 into contact with the substrate 20, and then heating the assembly to make the solder connections 25. A flux may be used during the soldering. After soldering, the underfill 30 is applied, for example, by needle-dispensing the underfill material along edges of the chip 15, drawing the underfill material into the space between the chip 15 and substrate 20 by capillary action, and heat-curing the underfill material to form a permanent bond. The underfill 30 may comprise any suitable material such as, for example, epoxy resin with one or more fillers. In a particular embodiment, the module 10 is a flip-chip module formed using C4 techniques.

The module 10 is not limited to this exemplary method of manufacture, however, and any suitable manufacturing processes and materials may be used to form the module 10. For example, although solder connections 25 are described, it is within the scope of the invention to provide the module 10 with any suitable electrical connection between the chip 10 and substrate, including, but not limited to: plated bump, stud bump, adhesive bump, etc. Moreover, the underfill 30 may be formed using any suitable technique including, but not limited to: molded underfill, or underfill that is applied to the chip 15 or substrate 20 prior to connecting the chip 15 to the substrate 20.

Figure 2:
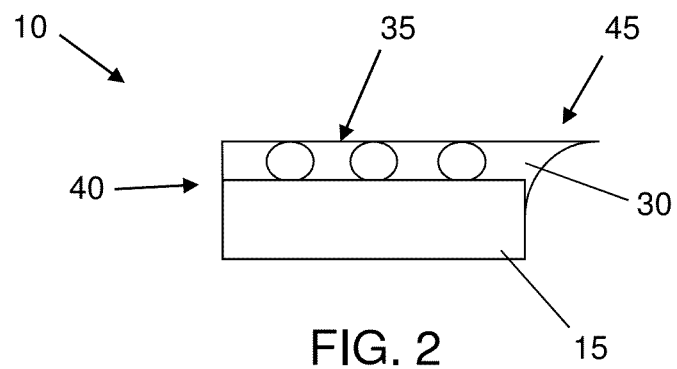

FIG. 2 shows the module 10 after processing in accordance with aspects of the invention. In embodiments, the substrate 20 is removed from the underfill 30, for example, by grinding. Removal of the substrate exposes a surface 35 of the underfill 30. Moreover, one or more sides of the module 10 are subject to grinding to produce a sidewall 40 which may be substantially perpendicular to the surface 35. The sidewall grinding eliminates the shoulder area 45 of the underfill 30.

Figure 3:
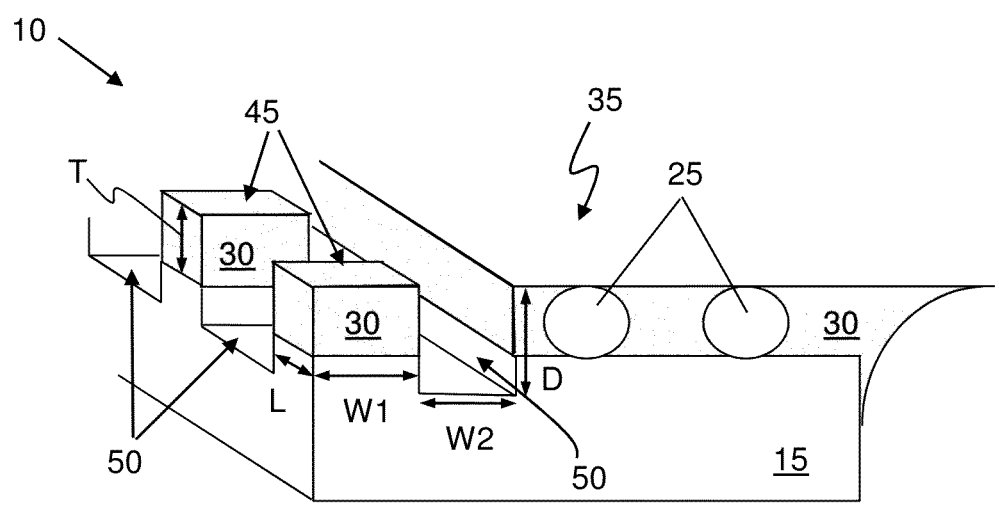

As depicted in FIG. 3, discrete blocks 45 of the underfill 30 are created by forming trenches 50 through the underfill 30 and into the chip 15. The trenches 50 may be formed in any suitable manner, such as with a dicing tool. In embodiments, the trenches 50 extend completely through the underfill 30 and partially into the chip 15, i.e., a depth of each trench 50 is greater than a thickness of the underfill 30 after grinding. For example, after removing (e.g., grinding) the substrate, the layer of underfill 30 may have a thickness "T" of about 50 µm to about 80 µm, and the trenches 50 may have a depth "D" of about 100 µm, each being measured downward from the top surface 35. In another example, the layer of underfill 30 has a thickness of about 25 µm to about 50 µm after removing the substrate, and the trenches 50 extend through the entire layer of underfill 30 and about 15 µm to about 50 µm into the chip 15. The invention is not limited to these exemplary dimensions, however, and any suitable dimensions may be used.

Figure 4:
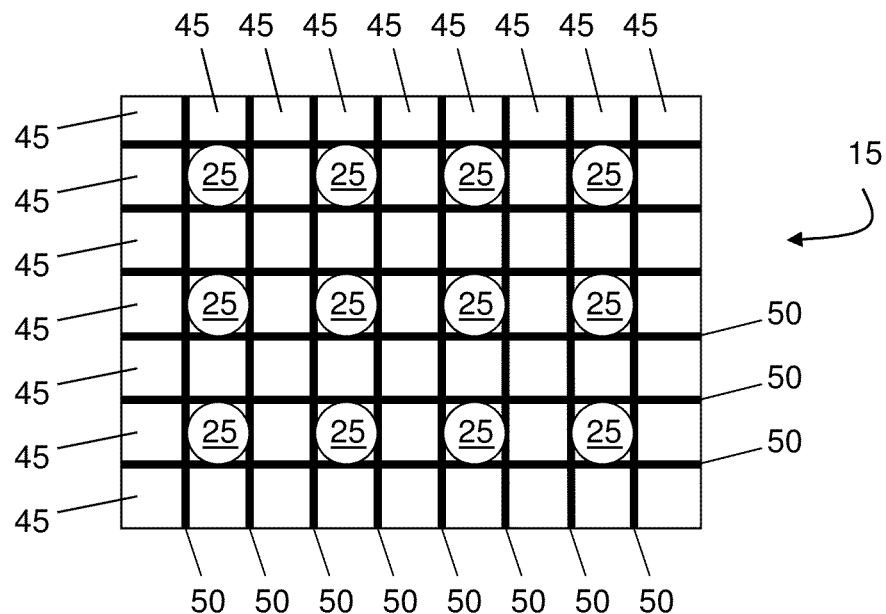

Any desired number of trenches 50 may be formed at any desired locations and in any desired pattern in the underfill 30. In particular embodiments, a plurality of intersecting and generally perpendicular trenches 50 are formed to create a plurality of substantially rectangular or square blocks 45 at the peripheral edges of the chip 15, as shown in FIGS. 3 and 4, with FIG. 4 being a top-down view showing plural blocks 45 defined by plural trenches 50. For example, the trenches 50 may be formed such that each block 45 has a length "L" of about 150 µm and a width "W1" of about 150 µm, and each trench 50 may have a width "W2" of about 100 µm, although the invention is not limited to these dimensions and any suitable dimensions may be used.

In embodiments, the trenches 50 are formed such that the blocks 45 do not contain any portion of a solder connection 25, e.g., as depicted in both FIGS. 3 and 4. In this manner, the adhesion of the underfill 30 to the chip 15 may be analyzed, instead of an adhesion of the combination of the underfill 30 and solder connection 25 to the chip 15. Moreover, by forming a plurality of blocks 45, the adhesion of the underfill 30 to the chip 15 may be analyzed at plural different locations on the chip 15, e.g., at a microscopic scale.

According to aspects of the invention, a block 45 is sheared (e.g., forcefully dislocated) from the chip 15 and the force required to produce the shearing is measured. This measured force represents a measure of the adhesion of the underfill 30 to the chip 15 at the particular location on the chip 15. Each block 45 may be sheared in a similar manner, such that implementations of the invention may be used to provide a map of local underfill adhesion values at plural locations on the chip 15.

Figure 5:
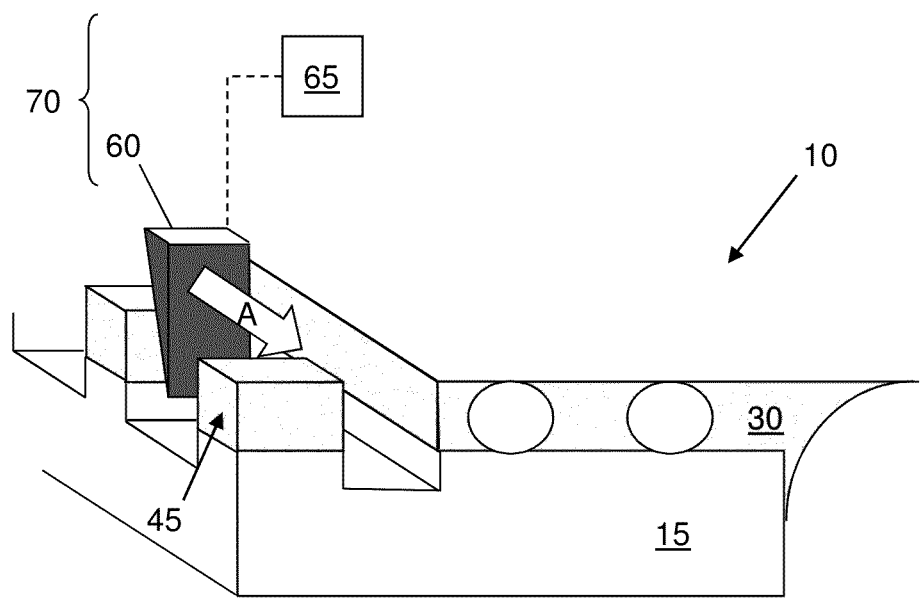

FIG. 5 shows an exemplary system and method for shearing a block 45 from the chip 15 in accordance with aspects of the invention. In embodiments, a shear blade 60 is pressed against a side of the block 45 and is laterally displaced in a controlled manner, e.g., as depicted by arrow "A", until the block 45 separates from the chip 15. A controller 65 associated with the blade 60 controls the movement of the blade 60 and also measures the force applied by the blade 60 to the block 45. The controller 65 may be configured to measure the force at which the block 45 shears from the chip 15 and to store data defining the measured force. The blade 60 and controller 65 may be part of a bond testing tool 70 which may comprise, for example: a movable stage for holding the module 10, user controls (e.g., joystick, manipulator, etc.), a microscope, and an integrated computer device (or a communication port for connecting to a computer device) that runs one or more software applications associated with measuring a force required to shear a block 45 from the chip 15.

The shearing of a block 45, e.g., as described with respect to FIG. 5, may be performed while controlling certain process parameters including, but not limited to: temperature, shear orientation, blade height, and blade speed. For example, the temperature may be controlled such that the shearing is performed at an elevated temperature. In embodiments, the module 10 is heated to a temperature that is greater than the glass transition temperature of the underfill 30. This helps ensure that the shearing occurs at the interface between the underfill 30 and the chip 15, rather than at a different interface between layers within the chip 15. In implementations, the module 10 is heated to about 150° C. plus or minus about 10° C., although other temperatures may be used since the glass transition temperature of the underfill 30 depends on the composition of the underfill material.

The shear orientation parameter may be controlled such that the blade 60 applies force to a block 45 in a particular direction relative to the chip 15, as described below with respect to FIG. 6. In embodiments, the module 10 and blade 60 are spatially oriented relative to each other such that the blade 60 applies force to the block 45 in a direction from the interior of the chip 15 toward the exterior of the chip 15.

Figure 6:
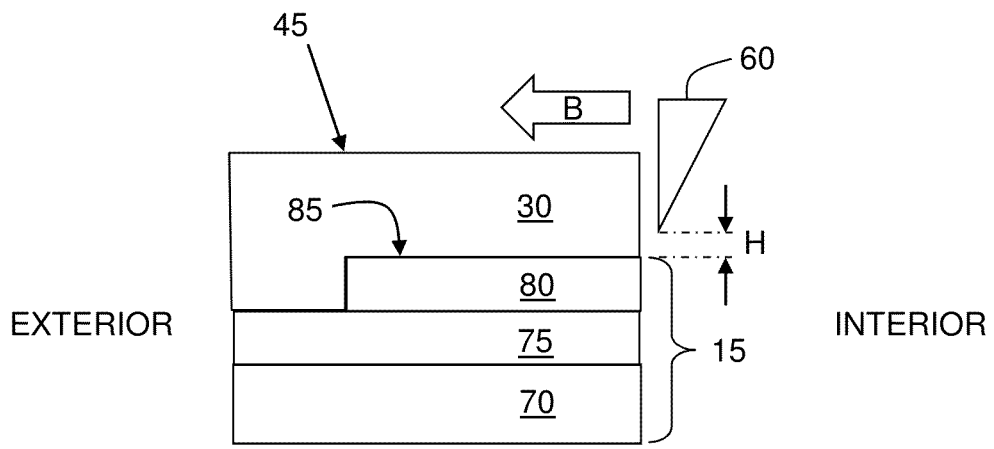

FIG. 6 shows a partial cutaway view of a module 10 in accordance with aspects of the invention. The chip 15 may comprise plural layers of material, such as a substrate 70, one or more layers of dielectric material(s) 75 (e.g., interlevel dielectric), and a passivation layer 80 (e.g., photosensitive polyimide). In embodiments, an interface 85 between the underfill 30 and the uppermost surface of the chip 15 is the desired shear location for measuring underfill adhesion. In some chips, the passivation layer 80 does not cover the entire top surface of the dielectric 75, such that the underfill 30 is adhered to the dielectric 75 at outer edges of the chip 15. In embodiments, the blade 60 is controlled to apply a shear force to the block 45 in the direction of arrow "B", e.g., from the interior of the chip 15 toward the exterior of the chip 15. This helps ensure that the shearing occurs at the interface 85 between the underfill 30 and the passivation layer 80, rather than at the interface between the passivation layer 80 and the dielectric 75. Shearing in the direction of arrow "B" also reduces the risk of damaging an adjacent block during the shearing of a particular block.

The blade height parameter may be controlled such that a lowermost tip of the blade 60 is located at a particular height relative to the block 45 and the interface 85 during the shearing of a block. In embodiments, the module 10 and blade 60 are spatially oriented relative to each other such that the blade 60 height "H" shown in FIG. 6 is about 5 μm plus or minus about 2 μm, although any suitable dimension may be used. When the blade height is too great, a moment (e.g., torque) is created that causes the block 45 to rotate off the chip 15, rather than translate across the surface of the chip 15. This rotation results in a lower measured shear force compared to when the block translates across the surface of the chip 15.

The blade speed parameter may be controlled such that the blade 60 moves at a particular rate during the shearing of a block. In embodiments, the controller 65 moves the blade at a maximum rate of about 25 μm/s, although other rates may be used within the scope of the invention. Limiting the blade speed (e.g., the rate of movement of the blade 60) reduces the risk of damaging an adjacent block during the shearing of a particular block.

Figure 7:
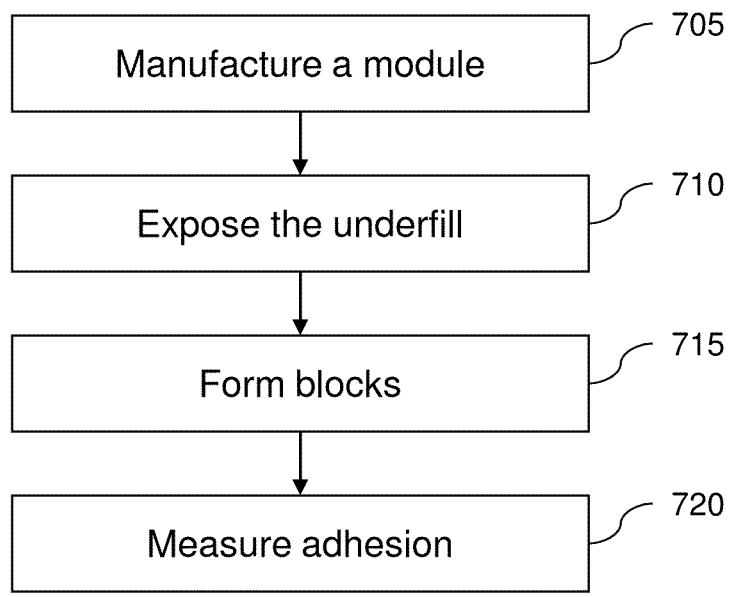
FIG. 7 shows a flow diagram of a method in accordance with aspects of the invention.

FIG. 7 shows an exemplary flow diagram for performing aspects of the present invention. The steps of FIG. 7 may be implemented in accordance with the description of FIGS. 1-6. The flow diagram illustrates the architecture, functionality, and/or operation of possible implementations of systems and methods according to various embodiments of the present invention.

More specifically, FIG. 7 shows a flow diagram for a method 700 of determining the adhesion of an underfill to a chip in accordance with aspects of the invention. At step 705, a module is manufactured. In embodiments, the module is similar to the module 10 described with respect to FIG. 1, and includes a chip connected to a substrate by solder connections and an underfill between the chip and substrate. In embodiments, the underfill is adhered to the chip and substrate and surrounds the solder connections. The module may be manufactured using conventional semiconductor processing techniques and materials.

At step 710, the underfill is exposed by modifying a shape of the module. This may be performed as described above with respect to FIG. 2, e.g., by grinding the substrate to thereby expose an upper surface of the layer of underfill. Step 710 may also comprise grinding a side portion of the module, also as described above with respect to FIG. 2.

At step 715, blocks of the underfill are formed on the module. This may be performed as described above with respect to FIGS. 3 and 4, e.g., by forming trenches through the layer of underfill and into the chip, thereby resulting in freestanding blocks of underfill material still adhered to the underlying chip.

At step 720, the adhesion of the blocks to the chip is measured. This may be performed as described above with respect to FIGS. 5 and 6, e.g., by shearing the respective blocks from the chip and measuring the force required to accomplish the shearing of each block. Step 720 may include controlling at least one parameter to cause the shearing (e.g., dislocating) of the blocks to occur at an interface between the underfill material and an uppermost surface of the chip, e.g., by controlling at least one of: temperature, shear orientation, and blade height.

The method 700 may be used to measure the adhesion of an underfill material to a chip at a plurality of locations on the chip, wherein the underfill material and the chip are included in a manufactured module. The plurality of locations are defined by the trenches formed in the underfill, and the trenches may be located such that the plurality of locations are devoid of solder connections, e.g., the blocks of underfill material do not contain any of the solder connections as shown in FIGS. 3 and 4. Although the method has been described with respect to measuring the adhesion of the underfill material to the surface of a chip, the method may also be used to measure the adhesion of an underfill material to any surface in a manufactured flip-chip module (e.g., flip-chip package).

As described herein, implementations of the invention provide systems and methods for measuring the adhesion of underfill to a chip on a microscopic scale at plural locations on the chip. In embodiments, the adhesion measurements are obtained from a manufactured module, e.g., an electronics module that is manufactured using manufacturing processes that are used for production electronics packages. Since the adhesion measurements are obtained from a manufactured module, these measurements can be used to identify manufacturing process parameters that affect the adhesion of the underfill to the chip. Moreover, by measuring the underfill adhesion at plural locations on the chip on a microscopic scale, localized patterns of adhesion can be detected using implementations of the invention.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein

What is claimed:

1. A method, comprising:
    forming a flip-chip module including a chip connected to a substrate with a layer of underfill material adhered to the chip and the substrate;
    removing the substrate to expose the layer of the underfill material;
    forming a block from the layer of underfill material, wherein the removing the substrate is performed prior to the forming the block; and
    measuring a force required to shear the block from a surface of the flip-chip module.

2. The method of claim 1, wherein the removing the substrate comprises grinding the substrate.

3. A method, comprising:
    forming a flip-chip module including a chip connected to a substrate with a layer of underfill material adhered to the chip and the substrate;
    forming a block from the layer of underfill material; and
    measuring a force required to shear the block from a surface of the flip-chip module, wherein the forming the block comprises forming a plurality of trenches in the layer of underfill material.

4. The method of claim 3, wherein the forming the plurality of trenches in the layer of underfill material comprises dicing.

5. The method of claim 3, wherein the forming the plurality of trenches comprises forming each one of the plurality of trenches completely through the layer of underfill material and partially into the chip.

6. A method, comprising:
forming a flip-chip module including a chip connected to a substrate with a layer of underfill material adhered to the chip and the substrate;
forming a block from the layer of underfill material; and
measuring a force required to shear the block from a surface of the flip-chip module,
wherein the surface of the flip-chip module is a surface of the chip; and
the measuring the force required to shear the block comprises shearing the block from the chip.

7. The method of claim 6, wherein the shearing is performed at an interface between the layer of underfill material and the chip.

8. The method of claim 6, wherein the shearing comprises:
arranging a tool against a side of the block; and
using the tool to apply a translational force to the block that is sufficient to dislocate the block from the chip.

9. The method of claim 6, wherein the shearing comprises controlling at least one of: temperature, shear orientation, blade height, and blade speed.

10. The method of claim 6, wherein the shearing comprises elevating the module to a temperature that exceeds a glass transition temperature of the underfill material.

11. A method to determine an adhesion force of an underfill material to a surface in a flip-chip module, comprising:
forming trenches in the underfill material, wherein the trenches create at least one free-standing block of the underfill material adhered to the surface;
pressing a blade against a wall of the at least one block until the at least one block dislocates from the surface; and
measuring a force applied by the blade during the dislocating of the at least one block from the surface.

12. The method of claim 11, wherein the at least one block comprises a pattern of a plurality of free-standing blocks of the underfill material defined by the trenches.

13. The method of claim 11, wherein:
the surface is a surface of a chip; and
the flip-chip module initially comprises a substrate connected to the chip by solder connections, and further comprising removing the substrate prior to the forming the trenches.

14. The method of claim 13, wherein the at least one block is devoid of any of the solder connections.

15. The method of claim 11, wherein the trenches have a depth that is greater than a height of the at least one block.

16. The method of claim 11, wherein the surface is an uppermost surface of a chip, and further comprising controlling at least one parameter to cause the dislocating to occur at an interface between the underfill material and the uppermost surface of the chip.

17. The method of claim 16, wherein the at least one parameter comprises at least one of: temperature, shear orientation, and blade height.

18. A method comprising measuring adhesion of an underfill material to a chip at a plurality of locations on the chip, wherein the underfill material and the chip are included in a manufactured module, wherein the measuring comprises forming a plurality of trenches in the underfill material, wherein the trenches define a plurality of blocks of the underfill material.

19. The method of claim 18, wherein the measuring comprises:
for each one of the plurality of blocks, shearing the block from an upper surface of the chip while measuring a force applied during the shearing.

20. The method of claim 18, wherein the plurality of locations on the chip are devoid of solder connections.

* * * * *